United States Patent [19]

Ikeda et al.

[11] Patent Number: 4,536,250

[45] Date of Patent: Aug. 20, 1985

[54] METHOD OF MAKING LIQUID JET RECORDING HEAD

[75] Inventors: Masami Ikeda, Machida; Hiroto Matsuda, Ebina; Makoto Shibata; Hiroto Takahashi, both of Hiratsuka, all of Japan

[73] Assignee: Canon Kabushiki Kaisha, Tokyo, Japan

[21] Appl. No.: 600,150

[22] Filed: Apr. 13, 1984

[30] Foreign Application Priority Data

Apr. 20, 1983 [JP] Japan .................................. 58-69586

[51] Int. Cl.³ .......................... C23F 1/02; B44C 1/22; C03C 15/00; C03C 25/06
[52] U.S. Cl. .................................. 156/651; 156/656; 156/661.1; 346/140 R
[58] Field of Search .............................. 156/629–630, 156/633, 634, 644, 650–653, 654–657, 659.1, 661.1; 346/1, 75, 140

[56] References Cited

U.S. PATENT DOCUMENTS 4,047,184 9/1977 Bassous et al. ............. 156/661.1 X
4,468,282 8/1984 Neukermans ................... 156/644 X Primary Examiner—William A. Powell
Attorney, Agent, or Firm—Fitzpatrick, Cella, Harper & Scinto

[57] ABSTRACT

A method of making a liquid jet recording head having a liquid discharge section including orifice means for discharging the liquid to form flying droplets thereof and liquid passage means communicating with said orifice means and having a thermally acting portion for causing a thermal energy to act on the liquid to form the liquid droplets, and electro-thermal converting means including a heat generating resistive layer on a substrate, at least one pair of opposed electrodes electrically connected with said heat generating resistive layer and a heat generating part between said electrodes, which method comprises the steps of forming the electrodes and heat generating portion through at least first and second etching processes, a photoresist pattern formed by the first etching process having a width smaller than those of photoresist patterns formed by the second and successive etching processes.

4 Claims, 13 Drawing Figures (a)

(b)

(c)

(d)

(e)

(f)

(g)

METHOD OF MAKING LIQUID JET RECORDING HEAD

BACKGROUND OF THE INVENTION

1. Field of the Invention

The present invention relates to a method of making a liquid jet recording head, and in particular, a liquid jet recording head for jetting a recording liquid used in the so-called ink jet recording process to form flying droplets of the recording liquid.

2. Description of the Prior Art

An ink jet recording method (liquid jet recording method) enables high speed recording with negligible noise being generated during recording and also enables recording on a plain paper without requiring fixing or other special treatment. Accordingly, interest in this method has been increasing.

A liquid jet recording method disclosed in Japanese Patent application Laid-Open No. 54-51837 and German application DOLS No. 2843064 has a feature different from a conventional liquid jet recording method in that heat energy is applied to liquid to generate a motive force to jet the liquid droplet.

The method disclosed in the above patent applications is characterized in that liquid acted on by the heat energy creates a change of phase which results in a rapid increase in volume and liquid is jetted from an orifice at an end of a recording head by the change of phase so that a flying liquid droplet is formed and deposited on a record medium to form a record.

Particularly, the liquid jet recording method disclosed in the German application DOLS No. 2843064 is not only effectively applicable to a so-called drop-on demand recording method but also enables implementation of a recording head of a full line type having a high density multi-orifice head. Thus, it can provide a high resolution and high quality image at a high speed.

The recording head used in a device for the above method includes a liquid jet unit having an orifice for jetting liquid and a liquid path communicating with the orifice for forming a heat applying unit which applies heat energy to the liquid to jet a liquid droplet, and an electro-thermal transducer for generating the heat energy.

The electro-thermal transducer includes a pair of electrodes and a heat generating resistance layer connected to the electrodes for defining a heat generating region (heat generating portion) between the electrodes.

When such a liquid spray recording head is used, the electrodes and heat generating portions between the electrodes are formed first by laminating an electrothermal member of $HfB_2$ as a heat generating resistive layer and metal layers of Al, Ti or the like as electrode layers on a substrate of glass, silicon, ceramic or the like, in order, by the use of sputtering or the like. This lamination is then formed with a preselected pattern by a photolithographic process utilizing a photoresist material (photosensitive resin). Finally, each layer is etched by the wet- or dry-etching process.

This etching process presents a certain problem needing to be improved and the improvement will be described below.

FIG. 1 is a fragmentary plan view showing, in an enlarged scale, an electro-thermal converting assembly formed in accordance with the prior art etching process. This assembly includes a substrate 101, a plurality of electrodes 102 and 103 formed on the substrate 101 and a heat generating portion 104 formed between each pair of electrodes 102, 103. As shown in FIG. 1, the assembly often has bridges 105 between each adjacent electrodes and bridges 106 between each adjacent heat generating resistive layers 107 (which layers are formed under the electrodes 102, 103 except the heat generating portion in the same pattern as that of the electrodes). These bridges 105 or 106 are formed of the electrode or heat generating resistive material which has remained on the substrate without being subjected to etching for any reason, which may, for example be due to residue on the substrate, a defect in the photomask, air bubbles produced on etching, or the like. The bridges highly decrease the reliability and production yield of the recording heads. The creation of the bridges 105 and 106 will further be increased as the density of the recording pattern is increased to improve the density of a recording head with a high-density multi-orifice, that is, when the spacings between each adjacent electrodes and between each adjacent heat generating resistive layers become smaller.

The bridges 105 and 106 can be removed, for example, by forming the same photoresist patterns on the substrate having these bridges and treating this pattern by etching so that the bridges will be dissolved and removed. This is however disadvantageous in that the end and side edges of the electrodes 102 and 103 are further etched into irregular edges as shown in FIG. 2(a) or the heat generating resistive layers 107 under the respective electrodes 102 and 103 are subjected to excessive etching as shown in FIG. 2(b). This means that the accuracy of finishing, the durability of the head portion contacting the liquid and the production yield will be decreased. Another method of removing the bridges may be provided by applying a high voltage to the electrodes 102 and 103 to burn away the bridges 106 with an excessive current. If the bridge 106 fails to be completely burnt away, however, its remainder provides irregular shapes or processes on the substrate 101. If the electrodes and heat generating portions are further covered by a protective layer, the latter also may more frequently be formed with defects. This, when the bridge remainder is on a head portion to be contacted by the ink, the latter may penetrate into the electrothermal converting assembly to damage its electrodes 102, 103 and heat generating resistive layers 107. But even if the protective layer is not affected, or if no protective layer is used since the electrode and heat generating resistive layers are made of a material that has superior resistance to ink and mechanical strength, the current used to burn away the bridges will flow through the heat generating resistive layers and can damage them. Therefore, this method cannot also be used to remove the bridges since it decreases the reliability in produced recording heads.

SUMMARY OF THE INVENTION

It is an object of the present invention to provide a method of fabricating a liquid jet recording head, and particularly its heat generating parts, with increased yield and reliability.

Another object of the present invention is to provide a method of fabricating a liquid jet recording head which can durably be used in a frequent repetition during a long time period while stably maintaining the shape of liquid drops.

Still another object of the present invention is to provide a method of fabricating a liquid jet recording head which comprises a liquid discharge section including an orifice for discharging the liquid to form the flying droplets and a liquid passage communicating with the orifice and having as a part a thermally acting portion for causing a thermal energy to act on the liquid to form the liquid droplets; and an electro-thermal transducer including a heat generating resistive layer on a substrate, at least a pair of opposed electrodes electrically connecting with the heat generating resistive layer, and a heat generating portion being formed between the electrodes, wherein the method comprises the steps of forming each of the electrodes and heat generating portion through at least two etching processes a photoresist pattern formed in the first etching process having a width smaller than those of photoresist patterns formed in the second and successive etching processes.

DESCRIPTION OF THE PREFERRED EMBODIMENTS

Figure 3:
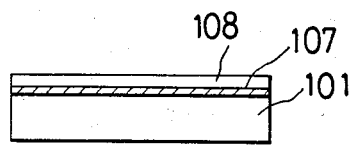
FIGS. 3(a) to (g) are sectional views taken along a one dot-chained line A—A' of a recording head like that in FIG. 1, but illustrating steps of forming the electrode of a liquid jet recording head according to the present invention.
Figure 3:
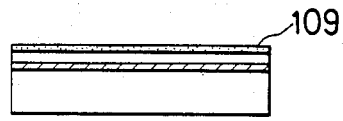
Figure 3:
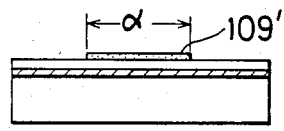
Figure 3:
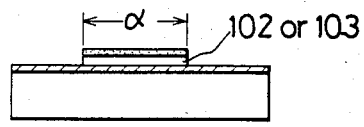
Figure 3:
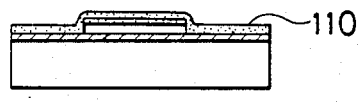
Figure 3:
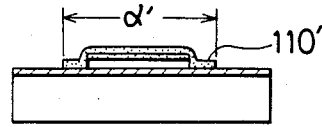
Figure 3:
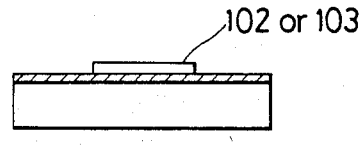

Referring to FIGS. 3(a) to (g), a heat generating resistive layer 107 having a thickness of 0.5 $\mu$m HfB$_2$ is deposited on a glass substrate 101 having a thickness of 0.7 mm (Corning Company, 7059) by the use of sputtering to form a heat generating resistive layer 107, in the first step shown in FIG. 3(a). By electron beam deposition, subsequently, a layer of Ti having a thickness of 0.005 $\mu$m is formed on the heat generating resistive layer and a layer of Al having a thickness of 1 $\mu$m is laminated on the layer of Ti. As the result, an electrode layer 108 is formed on the heat generating resistive layer.

A first etching process is then carried out to obtain the predetermined shape of the electrode. In the first etching process, after cleaning the substrate 101 on which the electrode and heat generating resistive layers 108, 107 are laminated and drying them, a photoresist film 109 is, as shown in FIG. 3(b), laminated by the use of the spinner process. Subsequently photoresist film 109 is exposed to light by the use of a mask-aligner and processed in the development process to form a photoresist pattern 109' corresponding to the predetermined electrode shape on the electrode layer 108 as shown in FIG. 3(c). The width of the photoresist pattern 109 is designated by "$\alpha$" in FIGS. 3(c), 3(d) and 4. The unnecessary portion of the electrode layer exposed by the photoresist film is subsequently removed from the substrate 101 by the use of the etchants for Al and Ti. Thus, the electrode 102 or 103 having the predetermined final shape is formed on the substrate 101 as shown in FIG. 3(d).

Figure 1:
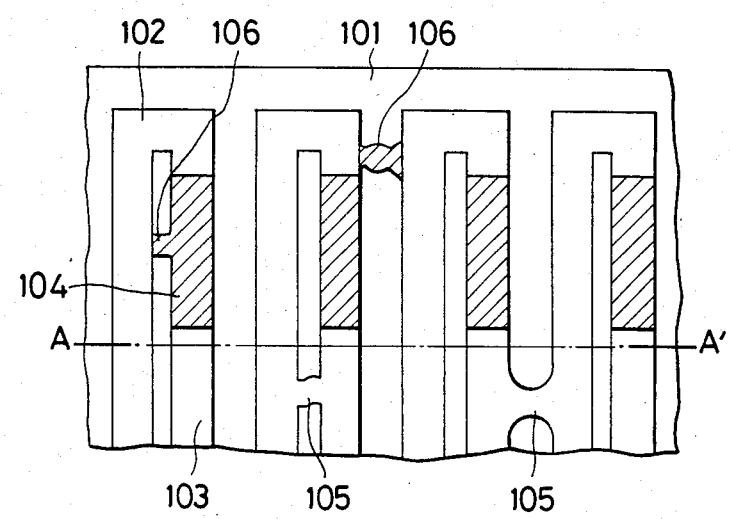
FIG. 1 is a plan view showing electrodes and heat generating portions which are formed on a substrate in accordance with the prior art method.
Figure 2:
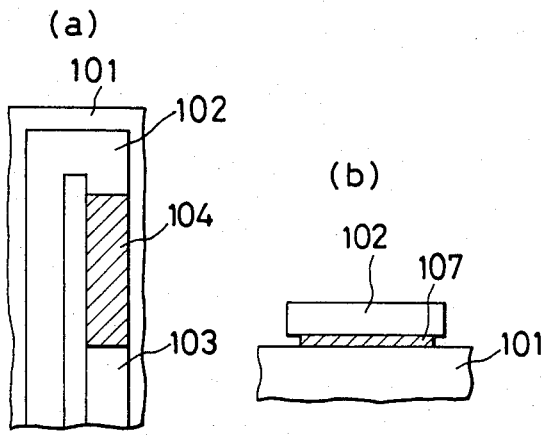
FIGS. 2(a) and (b) illustrate an over-etching in the prior art.

The above processes are the same as those of the prior art. Upon completion of all these processes, there can be produced remnants of the layer 108, such as the bridge 105 as shown in FIG. 1, which causes a problem in the prior art. This bridge 105 can effectively be removed with a higher accuracy by the use of a second etching step in accordance with the present invention as will be described below.

The substrate having the electrode of the predetermined shape formed in the first etching process is again laminated with a photoresist layer 110 by the use of the spinner process as shown in FIG. 3(e). As shown in FIG. 3(f), subsequently, a second photoresist pattern 110' is formed in the same photolithographic manner as in the first etching process. The photoresist pattern formed in the second etching process has its width $\alpha'$ larger than the width $\alpha$ of the photoresist pattern 109' formed in the first etching process. After formation of the second photoresist pattern 110', the etching is carried out by the use of etchants for Al and Ti until the bridges 105 between each adjacent electrodes are completely removed. Finally, the remaining photoresist patterns 109' and 110' are removed from the electrodes 102 and 103 by the use of a photoresist removing liquid to form electrodes having the desired final shape with higher accuracy.

The heat generating resistive layer 107 also is similarly formed through two etching processes with the width $\alpha'$ of the photoresist pattern formed in the second etching step being larger than the width $\alpha$ of the photoresist pattern formed in the first etching processes.

Although the above embodiment has been described as to laminate the successive photoresist pattern 110 on the photoresist pattern 109 prior to the second etching process as shown in FIG. 3(e), the photoresist pattern 110 may be laminated after the photoresist pattern 109' has been removed by the removing liquid.

Although the above embodiment has been described as to the wet-etching process, the present invention can similarly be applied to the anode oxidation or dry-etching process. These processes may be utilized solely or in combination, for example, so that the first etching process is different from the second etching process.

Figure 4:
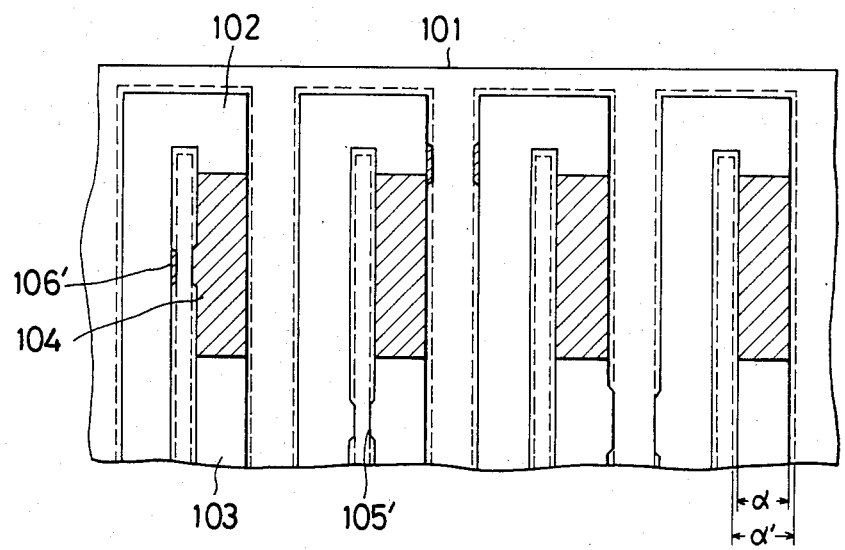
FIG. 4 is a plan view showing electrodes and heat generating portions which are formed on a substrate in accordance with the method of the present invention.

FIG. 4 is a plane view of electrodes 102 and 103 and a heat generating portion 104 formed on the substrate 101 according to the method of the present invention. As shown in FIG. 4, solid a line shows the portions of the photoresist pattern formed in the first etching process, which have a width $\alpha$ smaller than the width $\alpha'$ of the photoresist pattern 110' formed in the second etching process as shown by dotted line. As a result, the first photoresist pattern can be protected by the second photoresist pattern without affection of the etchant. In addition, the bridges are completely removed from the substrate 101.

Although the bridges are completely removed by etching in the above embodiment, it is not necessary to completely remove the bridge. That is to say, it is necessary only that each adjacent electrodes are sufficiently electrically disconnected with each other. However it is necessary to provide such a distance that any input signal is not adversely affected by the adjacent electrodes in the nearest portion between each adjacent electrodes.

In accordance with the method of the present invention, the formation of the electrodes and heat generating portions is carried out through two etching processes such that the photoresist pattern formed by the first etching processes has a width smaller than that of the photoresist pattern formed by the second etching step. Therefore, the complete photoresist pattern obtained in the first etching processed can be protected by the second photoresist pattern. Additionally, the second etching step serves to remove only the bridges between each adjacent electrodes and between each adjacent heat generating resistive layers, which bridges may adversely affect the accuracy of the recording head. In this manner, the recording head can be produced without any reduction in durability, reliability and accuracy of finishing. Particularly, the electrodes and heat generating parts of the recording head can be improved in yield.

Table 1 shows comparative results between the prior art method in which a single etching process is utilized and the method of the present invention in which two etching steps are used to form the electrodes and heat generating portions. As will be apparent from this table, the method according to the present invention is more effective and useful when it is desired to provide a recording head with high-density multi-orifice.

TABLE 1

| Density of Pattern | Yield of Product (%) | |
|---|---|---|
| (Pel) | Prior Art | The Present Invention |
| 4 | 82 | 98 |
| 8 | 66 | 90 |
| 12 | 45 | 82 |
| 16 | 37 | 75 |

Figure 5:
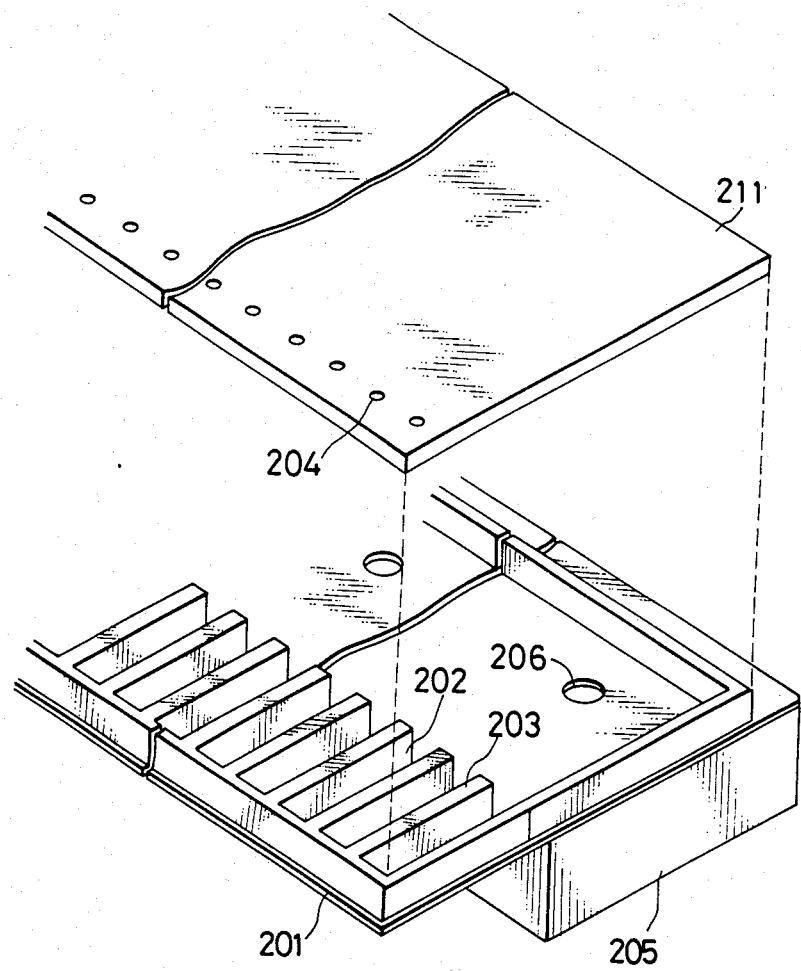
FIG. 5 is a perspective view schematically showing a liquid jet recording apparatus constructed in accordance with the present invention.

FIG. 5 schematically shows an embodiment of a liquid jet recording apparatus formed according to the present invention.

Referring to FIG. 5, there is shown a liquid jet recording apparatus constructed in accordance with the method of the present invention, which comprises a substrate 201, liquid passages 202, passage walls 203, orifices 204, a common liquid chamber 205, connecting holes 206 and a top plate 211 through which the orifices 204 are formed.

Figure 6:
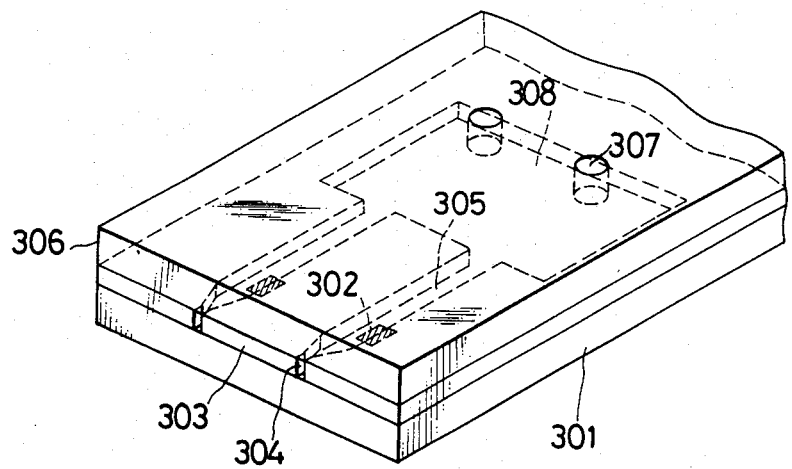
FIG. 6 is a schematical view of a liquid jet recording apparatus constructed in accordance with the method of the present invention.

FIG. 6 shows another form of a liquid jet recording apparatus according to the present invention, which comprises a substrate 301, electrothermal energy converting elements 302, a liquid passage forming member 303, orifices 304, liquid passages 305, a top plate 306, a supply port 307 for supplying the liquid from an external ink tank into the apparatus, and a common liquid chamber 308.

Either of the liquid recording apparatus shown in FIG. 5 or 6 is very effective on recording. In other words, the apparatus is manufactured with increased yield and provided liquid droplets having a constant size ejected from the orifices.

What we claim is:

1. A method of making a liquid jet recording head with a liquid discharge section, including orifice means for discharging liquid to form flying droplets thereof and liquid passage means communicating with said orifice means and having a thermally acting portion for causing thermal energy to act on the liquid to form said liquid droplets, said thermally acting portion including a heat generating resistive portion on a substrate between at least one pair of opposed electrodes electrically connected with said heat generating resistive portion, said method comprising the steps of:

performing a first etching process including providing a first photoresist pattern having a predetermined width to cover a portion of a layer on said substrate and forming at least one of said electrodes and said heat generating portion by etching the exposed portion of said layer; and performing a second etching process including providing a second photoresist pattern having a width greater than the width of said first photoresist pattern to enable removal of remnants of said exposed portion of said layer not removed in said first etching process.

2. A method according to claim 1, wherein said etching processes include a wet-etching process.

3. A method according to claim 1, wherein said etching processes include an anode oxidation process.

4. A method according to claim 1, wherein said etching processes include a dry-etching process.

* * * * *

UNITED STATES PATENT AND TRADEMARK OFFICE
CERTIFICATE OF CORRECTION

PATENT NO. : 4,536,250

DATED : August 20, 1985

INVENTOR(S) : Masami Ikeda, et al.

It is certified that error appears in the above-identified patent and that said Letters Patent is hereby corrected as shown below:

Column 2, line 44, "This" should read -- Thus --.

Column 4, line 53, "solid a" should read -- a solid --.

Signed and Sealed this

Twenty-ninth Day of April 1986

[SEAL]

Attest:

DONALD J. QUIGG

Attesting Officer   Commissioner of Patents and Trademarks